United States Patent [19]
Watanabe

[11] Patent Number: 5,910,741
[45] Date of Patent: Jun. 8, 1999

[54] PLL CIRCUIT WITH NON-VOLATILE MEMORY

[75] Inventor: Hiroyuki Watanabe, Kanagawa, Japan

[73] Assignee: NEC Corporation, Tokyo, Japan

[21] Appl. No.: 08/917,768

[22] Filed: Aug. 27, 1997

[30] Foreign Application Priority Data

Aug. 29, 1996 [JP] Japan .................................. 8-228915

[51] Int. Cl.$^6$ .............................. H03L 7/183; H03L 7/089
[52] U.S. Cl. ......................... 327/150; 327/159; 327/148; 327/157; 331/1 A; 331/16; 331/DIG. 2; 331/DIG. 3; 375/374
[58] Field of Search .................................. 327/147, 148, 327/150, 151, 156, 157, 159, 160; 375/373, 374, 375, 376; 331/1 A, 16, DIG. 2, DIG. 3, 17

[56] References Cited

U.S. PATENT DOCUMENTS

| | | | |
|---|---|---|---|
| 4,703,520 | 10/1987 | Rozanski, Jr. et al. | 331/25 |
| 5,422,911 | 6/1995 | Barrett, Jr. et al. | 375/327 |
| 5,608,355 | 3/1997 | Noguchi | 327/145 |
| 5,703,540 | 12/1997 | Gazda et al. | 331/16 |
| 5,757,238 | 5/1998 | Ferraiolo et al. | 327/105 |

FOREIGN PATENT DOCUMENTS 4-196715  7/1992  Japan ................................ H03L 7/06

*Primary Examiner*—Timothy P. Callahan
*Assistant Examiner*—Terry L. Englund
*Attorney, Agent, or Firm*—Whitham, Curtis & Whitham

[57] ABSTRACT

To provide a PLL circuit with little jitter and a minimum frequency drawing time, a PLL circuit comprises: a phase comparator for generating an up-down signal, which is turned to logic HIGH when a reference clock signal is phase-advanced to an output clock signal and a phase lock signal, indicating synchronization of the output clock signal to the reference clock signal; a timing signal generator for generating a timing signal when the phase lock signal is generated for a certain period after said timing signal generator is initialized with a reset signal; an up-down counter for generating a count value which is incremented when the up-down signal is at logic HIGH and decremented when the up-down signal is at logic LOW according to each pulse of a count clock, memorizing the count value in a nonvolatile memory when controlled by the timing signal, and outputting the memorized count value when initialized by the reset signal; a D/A converter for outputting a control voltage in proportion to the count value; and a VCO for providing the output clock signal according to the control voltage.

12 Claims, 8 Drawing Sheets

PLL CIRCUIT WITH NON-VOLATILE MEMORY

BACKGROUND OF THE INVENTION

The present invention relates to a PLL (Phase Lock Loop) circuit wherein the frequency drawing time and the frequency jitter are both reduced.

The PLL circuit is often used for preventing the clock skew in a system consisting of plural LSI (Large Scale Integrated) circuits.

In a LSI circuit, input signal is usually buffered and synchronized with a system clock at its input stage to be processed within its internal circuit, and the processed signal is also synchronized with the system clock at its output stage to be supplied through an output buffer to following LSI circuits. However, phase of the system clock supplied to output stage of an LSI circuit may differ to that supplied to input stages of its following LSI circuits, because of difference of delay times caused through system clock lines, that is, difference of numbers of buffers or load factors, for example, resulting in a clock skew disturbing correct data transfer.

The PLL circuit is used, in such a system, for driving all logic circuits, such as flip-flops consisting in counters, with the same timing, preventing the clock skew. Therefore, the frequency jitter of the PLL circuit used for preventing the clock skew should be strictly restricted, especially in a system having a high frequency system clock.

The PLL circuit is also used in digital audio equipment, such as CD (Compact Disk) players, DAT (Digital Audio Tape) players or BS (Broadcasting Satellite) tuners, wherein a clock signal is transfered together with digital audio data, according to a digital audio interface format, for re-generating the system clock by way of the PLL circuit, to be used for reproducing analog signals from the digital audio data.

Also in such a case, the PLL circuit with little jitter is required for reproducing high quality audio signals with accurate system clock.

FIG. 10 is a block diagram illustrating a PLL circuit disclosed for the purpose in a Japanese patent application laid open as a Provisional Publication No. 196715/'92.

Referring to FIG. 10, a PLL circuit according to this prior art comprises;

a phase comparator 11a for generating an up-down signal UD which becomes HIGH when a reference clock signal RCLK is phase advanced to an output clock signal CLK and vice versa, by comparing phases of the reference clock signal RCLK and the output clock signal CLK supplied thereto, a difference discrimination circuit 64 for generating a select signal SEL which indicates a slow count clock SCK when logic of the up-down signal UD alters, and indicates a fast count clock FCK when logic of the up-down signal UD remains at logic LOW or HIGH, a count clock selector 65 for selecting either the slow count clock SCK or the fast count clock FCK as a count clock CCLK according to the select signal SEL, an up-down counter 13a supplied with the up-down signal UD and the count clock CCLK for generating a count value COU which is incremented when the up-down signal UD is at logic HIGH while decremented when the up-down signal UD is at logic LOW, according to each pulse of the count clock CCLK, a D/A (Digital to Analog) converter 14 for outputting a control voltage VCT in proportion to the count value COU, and a VCO (Voltage Control Oscillator) 15 for providing the output clock signal CLK according to the control voltage VCT.

When the phase difference between the output clock signal CLK and the reference clock sign al RCLK is large, the phase comparator 11a maintains the up-down signal UD either at logic HIGH or at logic LOW, and so, the difference discrimination circuit 64 outputs the selection signal SEL so as to control the count clock selector 65 to select the fast count clock FCK. Therefore, the count value COU is incremented or decremented faster according to the fast count clock FCK than when the phase difference is minimum, where the up-down signal UD alters HIGH and LOW and the slow count clock SCK is selected and supplied to the up-down counter 13a as the count clock CCLK.

The output clock signal CLK, whereof frequency varies according to the control voltage VCT, namely, to the count value COU, is fed back to the phase comparator 11a, composing a feedback loop for automatically controlling the frequency and the phase of the output clock signal CLK.

FIG. 11 is a timing chart illustrating operation and the frequency drawing time, that is, a time necessary for the output clock signal CLK being phase-locked to the reference clock signal RCLK, of the PLL circuit of FIG. 10.

When the PLL circuit is initialized at a timing $t_i$, the count value COU is set to '0000b' (binary value of four bits, assuming the up-down counter 13a is a four bit counter), and potential of the control voltage VCT output of the D/A converter 14 is lowest. Assuming the frequency of the reference clock signal RCLK is 100 MHz and frequency variable range of the VCO 15 is prepared to be ±10%, the VCO 15 outputs, therefore, the output clock signal CLK of about 9 to 10 MHz lower than the reference clock signal RCLK at the timing $t_i$. So, the phase comparator 11a outputs the up-down signal UD at logic HIGH, which controls the up-down counter 13a to count up the count value COU at each pulse of the count clock CCLK, namely, the fast count clock FCK, as shown in FIG. 11, during the frequency drawing time ending at a timing $t_j$, wherein phase of the output clock signal CLK is drawn, or advanced step by step towards that of the reference clock signal RCLK according to the fast count clock FCK.

When the frequency of the output clock signal CLK becomes higher than that of the reference clock signal RCLK and its phase becomes advanced to that of the reference clock signal RCLK at the timing $t_j$, the up-down signal UD turns to LOW, which makes the count clock selector 65 select and output the slow count clock SCK. Therefore, the phase of the output clock signal CLK is locked near that of the reference clock signal RCLK, and the count value COU goes and returns between '1001b' and '1010b', for example, making the frequency jitter of the output clock signal CLK.

As beforehand described, the frequency jitter should be strictly restricted to prevent the clock skew for the PLL circuit to be applied in a system having a high clock frequency.

For reducing the minimum jitter in the prior PLL circuit of FIG. 10, minimum discrimination level of the D/A converter 14 should be made more fine by enlarging bit width of the up-down counter 13a, or in other words, frequency variation of the VCO 15 for '0001b' of the count value COU should be reduced by increasing a maximum count number thereof, with the same frequency variable range of the VCO 15.

However, it results in another problem that the wider bit width of the up-down counter 13a makes the longer the frequency drawing time.

For example, assume that the frequency of the reference clock signal RCLK is 100 MHz, the bit width of the up-down counter 13a is four bits and the frequency variation of the VCO 15 is 1 MHz/bit.

In the case, the frequency of the output clock signal CLK varies from 100 MHz to 99 MHz, for example, when the count value COU decreases by '0001b'. Therefore, the minimum jitter becomes about 100 pS, that is, the difference between a cycle of 10.0 nS of 100 MHz and that of 10.1 nS of 99 MHz.

Using an up-down counter having a bit width of five bits, the minimum discrimination level of the D/A converter 14 can be made half and the minimum jitter can be reduced to 50 pS.

However, when the PLL circuit is prepared to be phase-locked at half of the maximum count value, it becomes '10000b' with the up-down counter of five bits, namely, two times of the count value of the up-down counter of four bits, needing two times of the frequency drawing time.

For the purpose to reduce the frequency drawing time by counting up quickly, the fast count clock FCK is prepared to be supplied to the up-down counter 13a, in the prior PLL circuit of FIG. 10.

However, there is also a frequency limit of the fast count clock FCK. When frequency of the count clock is too high, elements of the up-down counter, such as flip-flops, can not follow the clock pulse, resulting in a malfunction of the up-down counter. For example, the frequency limit of the fast count clock FCK becomes about 100 MHz when the setup time of the flip-flops is about 2 nS, which makes the operation cycle of the up-down counter 13a about 8 nS.

SUMMARY OF THE INVENTION

Therefore, a primary object of the present invention is to provide a PLL circuit wherein an output clock signal of high frequency and little jitter can be obtained with a minimum frequency drawing time.

In order to achieve the object, a PLL circuit of the invention comprises:

a phase comparator for generating an up-down signal which is turned to logic LOW when a phase of an output clock signal is advanced to a phase of a reference clock signal and turned to logic HIGH when the phase of the output clock signal is delayed to the phase of the reference clock signal, and a phase lock signal indicating synchronization between the output clock signal and the reference clock signal;

a timing signal generator for generating a timing signal when the phase lock signal is generated for a certain period after the timing signal generator is initialized with a reset signal;

an up-down counter supplied with the reset signal, the up-down signal, the timing signal and a count clock for generating a count value which is incremented when the up-down signal is at logic HIGH and decremented when the up-down signal is at logic LOW according to each pulse of the count clock, memorizing the count value in a non-volatile memory when controlled by the timing signal, and outputting the count value memorized in the nonvolatile memory when initialized by the reset signal;

a D/A converter for outputting a control voltage in proportion to the count value; and a VCO for providing the output clock signal according to the control voltage.

Therefore, the D/A converter can output the control voltage having a voltage almost corresponding to frequency of the reference clock signal just after the initialization, in the PLL circuit according to the invention, making the frequency drawing time remarkably short, however wide the bit width of the up-down counter 13 is enlarged in order to reduce the frequency jitter.

BRIEF DESCRIPTION OF THE DRAWINGS

The foregoing, further objects, features, and advantages of this invention will become apparent from a consideration of the following description, the appended claims, and the accompanying drawings wherein the same numerals indicate the same or the corresponding parts.

In the drawings.

DETAILED DESCRIPTION OF THE PREFERRED EMBODIMENTS

Now, embodiments of the present invention will be described in connection with the drawings.

Figure 1:
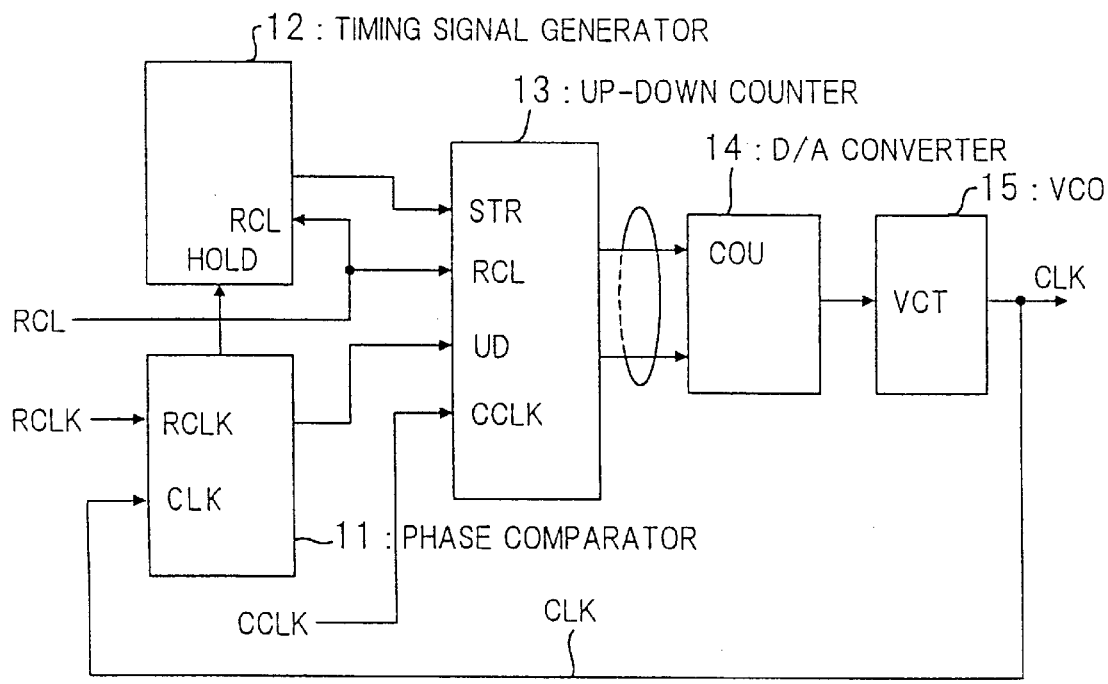
FIG. 1 is a block diagram illustrating a PLL circuit according to an embodiment of the invention.

FIG. 1 is a block diagram illustrating a PLL circuit according to an embodiment of the invention, comprising;

a phase comparator 11 for generating an up-down signal UD which becomes HIGH when a reference clock signal RCLK is phase-advanced to an output clock signal CLK and vice versa, and a phase lock signal HOLD which becomes HIGH only when phases of the reference clock signal RCLK and the output clock signal CLK are synchronized, by comparing phases of the reference clock signal RCLK and the output clock signal CLK supplied thereto, a timing signal generator 12 for generating a timing signal STR, referring to the phase lock signal HOLD and a reset signal RCL supplied from outside, an up-down counter 13 supplied with the reset signal RCL, the up-down signal UD, the timing signal STR and a count clock CCLK for generating a count value COU which is incremented when the up-down signal UD is at logic HIGH while decremented when it is at logic LOW according to each pulse of the count clock CCLK, memorizing the count value COU in a nonvolatile memory when indicated by the timing signal STR, and outputting a value memorized in the nonvolatile memory as the count value COU when initialized by the reset signal RCL, a D/A converter 14 for outputting a control voltage VCT in proportion to the count value COU, and a VCO 15 for oscillating the output clock signal CLK according to the control voltage VCT.

Figure 2:
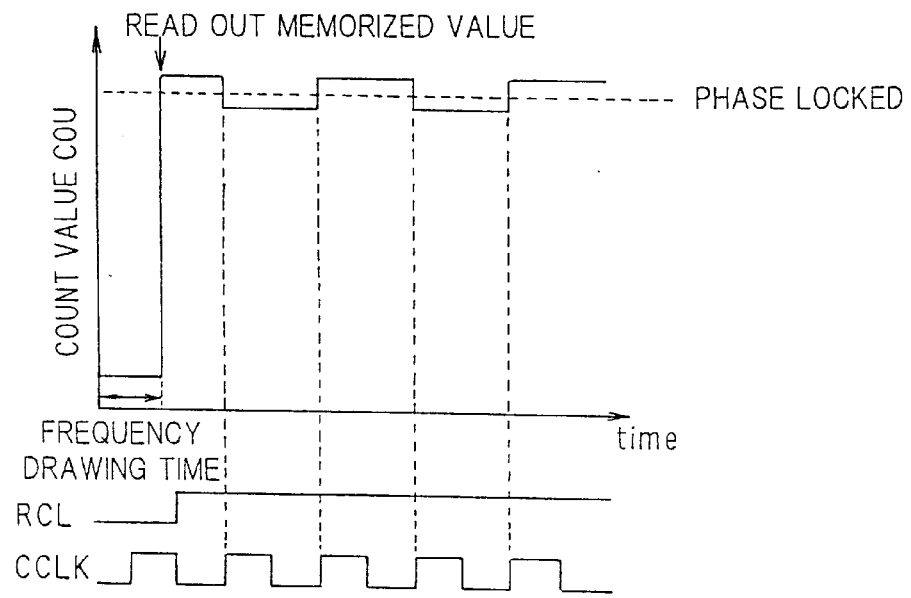
FIG. 2 is a timing chart illustrating operation of the embodiment of FIG. 1.

FIG. 2 is a timing chart illustrating operation of the embodiment of FIG. 1.

In the embodiment, the up-down counter 13 reads and outputs a value stored in the nonvolatile memory when it is reset with a low level of the reset signal RCL. In the nonvolatile memory, the count value COU when the PLL circuit was phase-locked stably after last initialization is stored, as will be described afterwards. Therefore, the D/A converter 15 can output the control voltage VCT having a voltage almost corresponding to frequency of the reference clock signal RCLK just after the initialization, making the frequency drawing time markably short.

Figure 10:
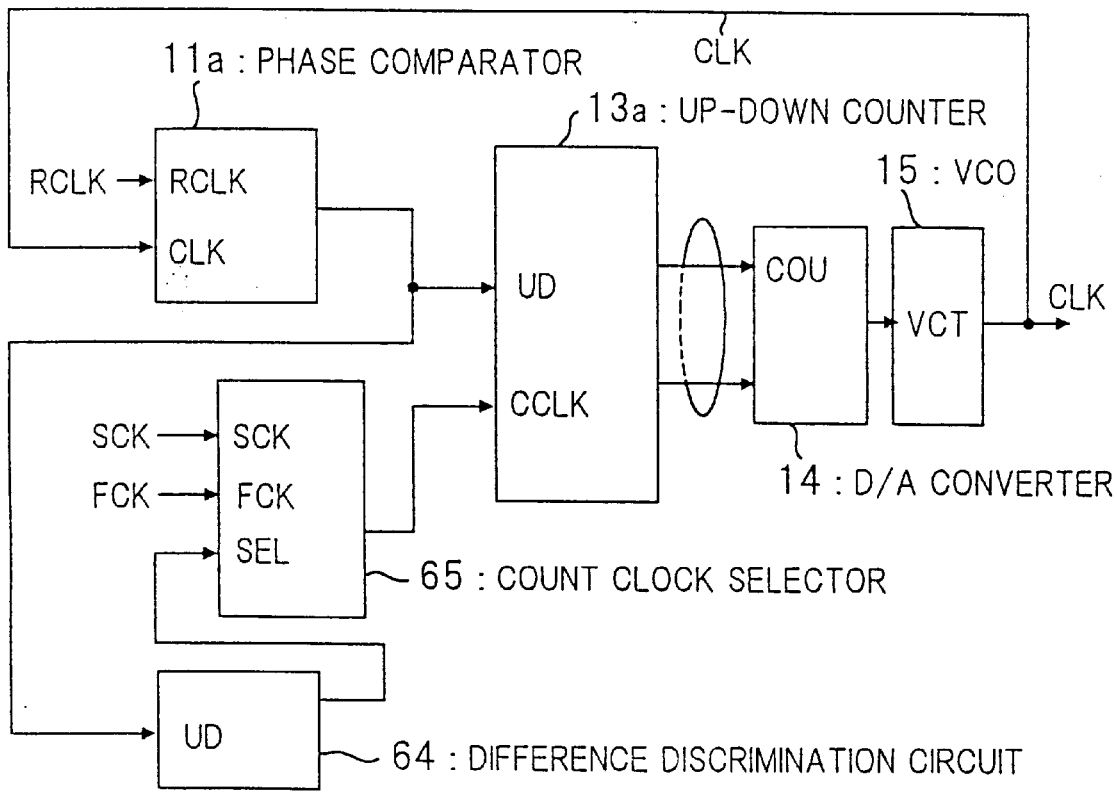
FIG. 10 is a block diagram illustrating a prior PLL circuit.
Figure 11:
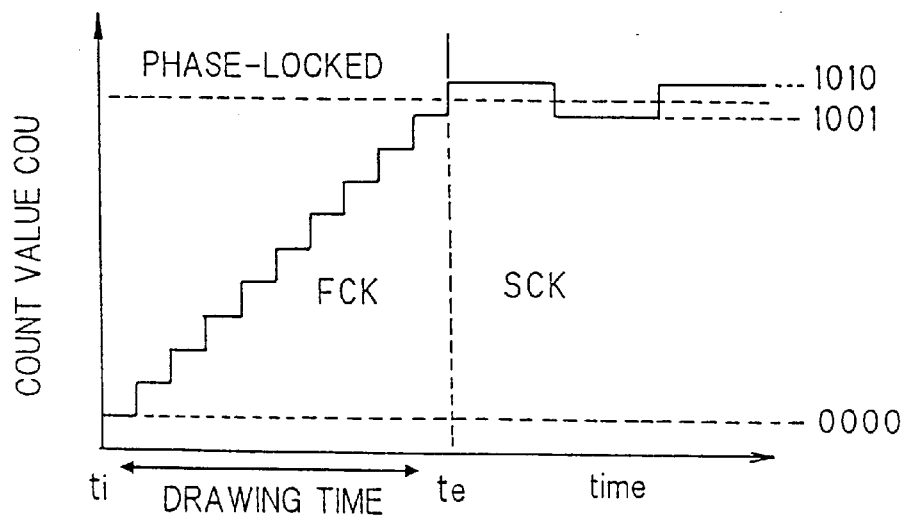
FIG. 11 is a timing chart illustrating operation and the frequency drawing time of the prior PLL circuit of FIG. 10.

When the reset signal RCL becomes HIGH, the up-down counter 13 begins to increment or decrement the count value COU, which is read out at the initialization, in the same way with the up-down counter 13a of FIG. 10 according to logic of the up-down signal UD at each pulse of the count clock CCLK, which may be supplied from outside, or may be the reference clock signal RCLK or the output clock signal CLK itself.

When the output clock signal CLK is stably phase-locked to the reference clock signal RLCK, the value stored in the nonvolatile memory is revised with the count value COU indicated by the timing signal STR.

In the following paragraphs, operation of the phase comparator 11, the timing signal generator 12 and the up-down counter 13 will be described. As for the D/A converter 14 and the VCO 15, they may be the same with those in the prior art of FIG. 10, and duplicated description is omitted.

Figure 3:
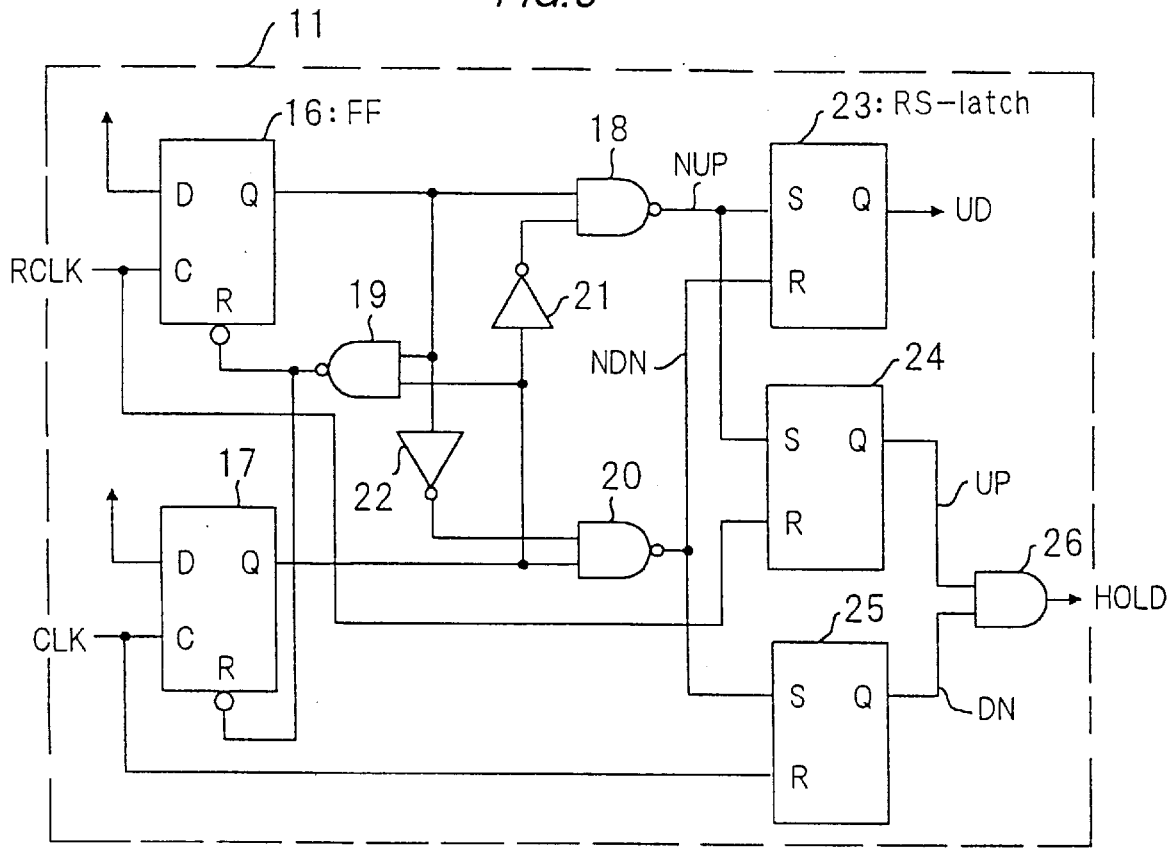
FIG. 3 is a circuit diagram illustrating a circuit example of the phase comparator 11 of FIG. 1.

FIG. 3 is a circuit diagram illustrating a circuit example of the phase comparator 13 according to the embodiment.

Referring to FIG. 3, the example comprises two flip-flops 16 and 17, three NAND gates 18 to 20, two inverters 21 and 22, three RS (Reset-Set type) latches 23 to 25 and an AND gate 26.

Logic HIGH is supplied to data terminals of the two flip-flops 16 and 17. The reference clock signal RCLK and the output clock signal CLK are supplied to clock terminals of the two flip-flops 16 and 17, respectively. NAND logic of output terminals of the two flip-flops 16 and 17 is supplied to reset terminals of the two flip-flops 16 and 17 through the NAND gate 19.

Logic of the output terminal of the flip-flop 16 and inverted logic of the output terminal of the flip-flop 17 through the inverter 21 are supplied to two input terminals of the NAND gate 18, while logic of the output terminal of the flip-flop 17 and inverted logic of the output terminal of the flip-flop 16 through the inverter 22 are supplied to two input terminals of the NAND gate 20.

Output NUP of the NAND gate 18 is supplied to set terminals of the two RS-latches 23 and 24, while output NDN of the NAND gate 20 is supplied to reset terminal of the RS-latch 23 and set terminal of the RS-latch 25. The reference dock signal RCLK is supplied to reset terminal of the RS-latch 24 and the output clock signal CLK is supplied to reset terminal of the RS-latch 25.

The up-down signal UD is obtained from output terminal of the RS-latch 23, and the phase lock signal HOLD is obtained as AND logic of two outputs UP and DN of the RS-latches 24 and 25 through the AND gate 26.

Figure 4:
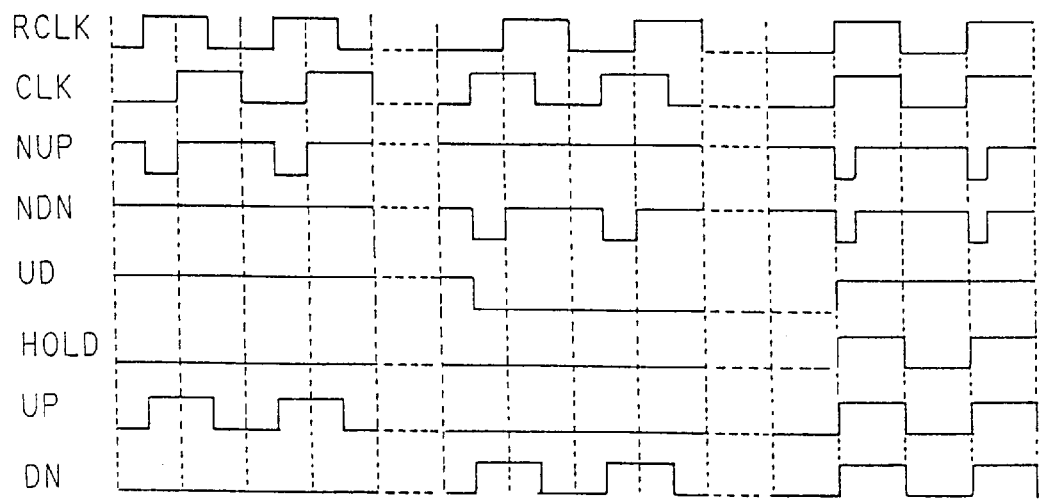
FIG. 4 is a timing chart illustrating operation of the phase comparator 11.

FIG. 4 is a timing chart illustrating operation of the phase comparator 11 of FIG. 3.

The outputs of the flip-flops 16 and 17 rise up at rising edges of the reference clock signal RCLK and the output clock signal CLK, respectively, which are both reset at rising edges of the later one of the two signals, for example the output clock CLK in the left part of FIG. 4, the reference clock signal RCLK and the output clock signal CLK, generating negative pulses in the output NUP of the NAND gate 18 or the output NDN of the NAND gate 20. The negative pulses are generated exclusively in either of the output NUP of the NAND gate 18 or the output NDN of the NAND gate 20, since those corresponding to the later one of the reference clock signal RCLK and the output clock signal CLK are inhibited by inverse logic of those corresponding to the other which is supplied to the other input terminal of the NAND gate 18 or 20.

The up-down signal UD, namely, the output of the RS-latch 23 is maintained at HIGH level with the negative pulses of the output NUP supplied to its set terminal, or at LOW level with the negative pulses of the output NDN supplied to its reset terminal.

When the reference clock signal RCLK and the output clock signal CLK are synchronized with each other, the outputs NUP and NDN turn to LOW at the same time and, after a delay time of the inverters 21 and 22, they are returned to HIGH level, making negative triggers in both the outputs NUP and NDN. The outputs UP and DN of the RS-latches 24 and 25 are set to HIGH level with the negative triggers or the negative pulses of the output NUP and NDN, respectively, and reset with falling edges of the reference clock signal RCLK and the output clock signal CLK, respectively. The phase lock signal HOLD becomes HIGH only when both the outputs UP and DN becomes HIGH. Therefore, positive pulses are generated in the phase lock signal HOLD only when the reference clock signal RCLK and the output clock signal CLK are synchronized with each other as shown in the right part of FIG. 4, and otherwise the phase lock signal HOLD remains at LOW level.

Thus, in the example of FIG. 3, the phase comparator 11 outputs the up-down signal UD at HIGH level, when the reference clock signal RCLK is phase-advanced to the output clock signal CLK, the up-down signal UD at LOW level when the output clock signal CLK is phase-advanced to the reference clock signal RCLK, and the phase lock signal HOLD having positive pulses when the output clock signal CLK is phase-locked to the reference clock signal RCLK.

Figure 5:
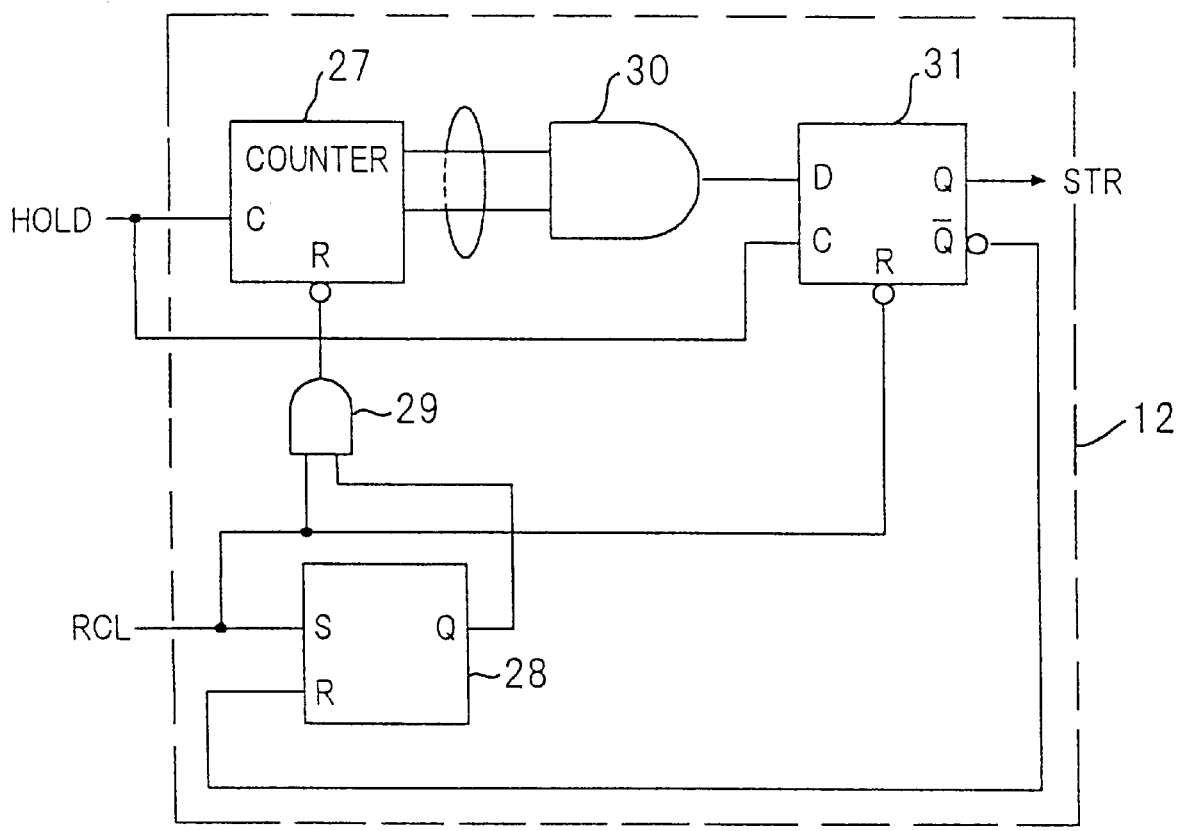
FIG. 5(A) is a circuit diagram illustrating an example of the timing signal generator 12 of FIG. 1.
FIG. 5(B) is a timing chart illustrating operation of the timing signal generator 12.
Figure 5:
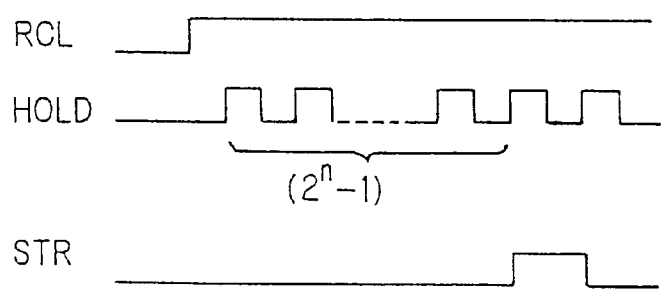

Now, an example of the timing signal generator 12 of FIG. 1 is described referring to a circuit diagram of FIG. 5(A) illustrating its configuration and a timing chart of FIG. 5(B) illustrating its operation.

Referring to FIG. 5(A), the example comprises;

a counter 27 for counting number of pulses of the phase lock signal HOLD to be output in parallel, an AND gate 30 for outputting AND logic of all of the parallel outputs of the counter 27, a flip-flop 31 whereof the output of the AND gate 30 is supplied to a data terminal, the reset signal RCL is supplied to a reset terminal and the timing signal STR is obtained from an output terminal, an RS-latch 28 whereof the reset signal RCL is supplied to a set terminal, inverse output of the flip-flop 31 is supplied to a reset terminal, and an AND gate 29 for supplying, to a reset terminal of the counter 27, AND logic of the reset signal RCL and output of the RS-latch 28.

As shown in FIG. 5(B), the counter 27 is reset with LOW level of the reset signal RCL. When the PLL circuit is phase-locked after the reset signal RCL is turned to HIGH level, pulses are generated in the phase lock signal HOLD, which are counted by the counter 27. When the parallel outputs of the counter 27 become all '1', that is, when pulse number attains to $2^n-1$ (n being number of the parallel outputs), the AND gate 30 outputs logic HIGH, which is latched by the flip-flop 31 at a following pulse of the phase lock signal HOLD and a positive pulse having a width of one cycle of the phase lock signal HOLD is output in the timing signal STR.

Once the timing signal STR is turned to HIGH, the RS-latch 28 is reset and logic LOW is supplied to the reset terminal of the counter 27, disabling the counter 27 for saving power consumption.

Thus, in the example of the timing signal generator of FIG. 5(A), the timing signal STR is generated when the PLL circuit is phase locked for a certain period determined by the bit width of the counter 27 after the initialization. The bit width of the counter 27 may be five or six bits, as 30 to 50 pulses in the phase lock signal HOLD are sufficient for discriminating the PLL circuit to be stably phase-locked.

Figure 6:
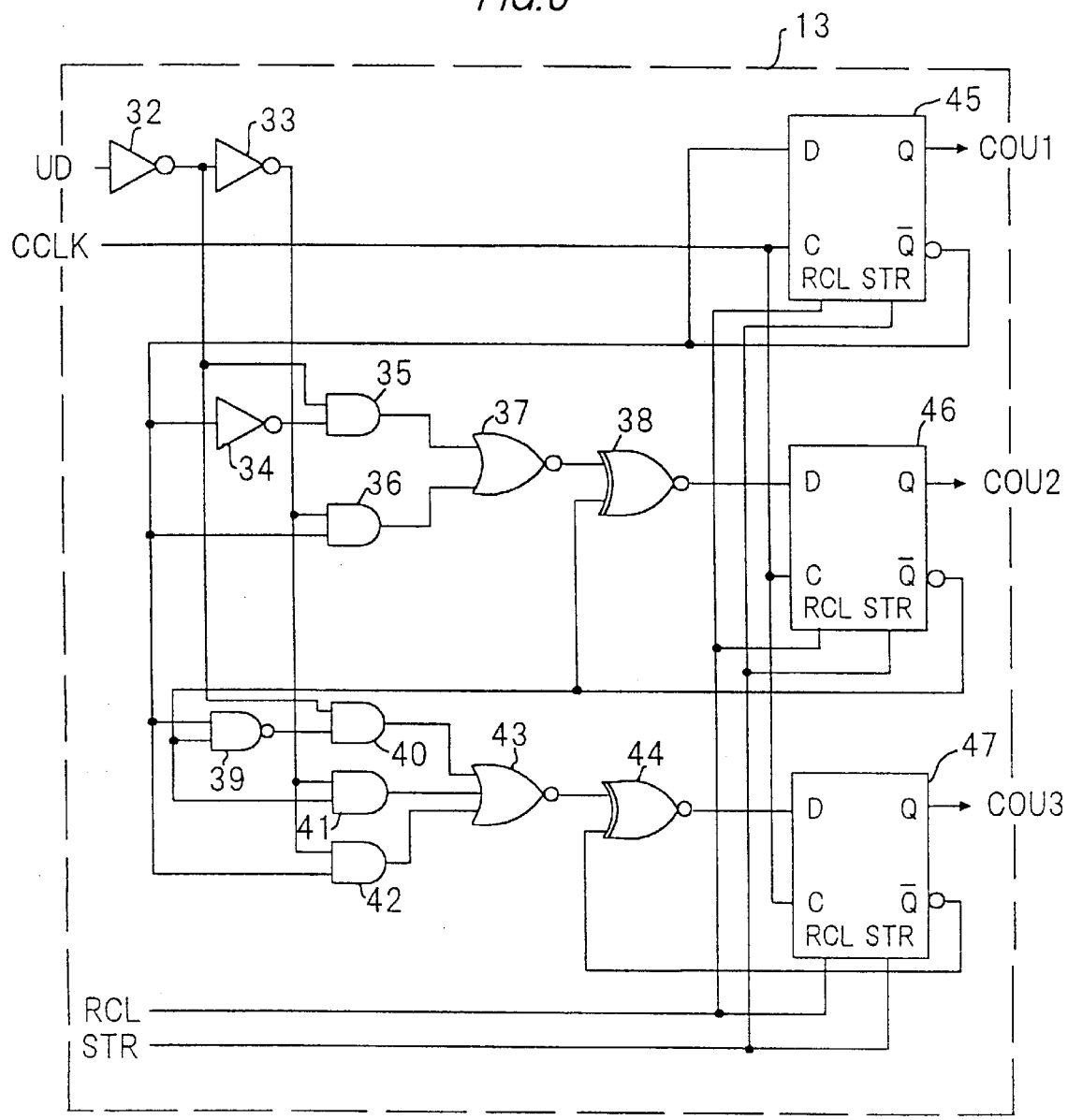
FIG. 6 is a circuit diagram illustrating an example of the up-down counter 13 of FIG. 1.
Figure 7:
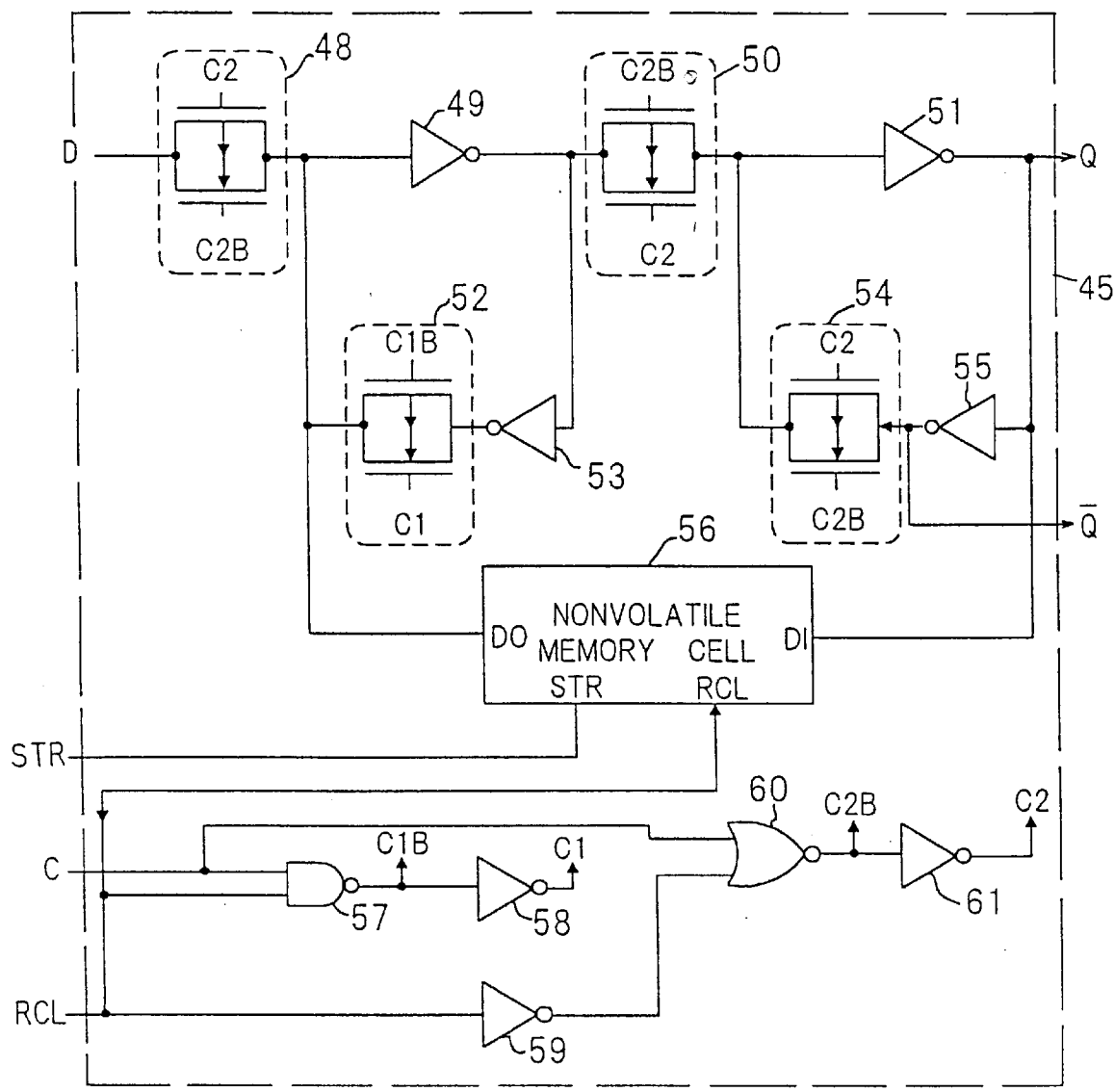
FIG. 7(A) is a circuit diagram illustrating an example of a flip-flop to be applied for the first to the third flip-flops 45 to 47 of FIG. 6.
FIG. 7(B) is a table chart illustrating status of transfer gates 48, 50, 52 and 54 according to logic of the reset signal RCL and the signal supplied to the clock terminal C of FIG. 7(A)

Now, the up-down counter 13 of FIG. 1 is described referring to FIGS. 6 and 7.

FIG. 6 is a circuit diagram illustrating an example of the up-down counter 13 according to the embodiment.

The circuit diagram of FIG. 6 represents an up-down counter having a bit width of three bits for outputting parallel signals COU1 to COU3 corresponding to three bits of the count value COU, wherein comprised;

first to third flip-flops 45 to 47 for outputting the parallel signals COU1 to COU3, each having a nonvolatile memory cell (details are described afterwards), two inverters 32 to 33 for obtaining logic and inverse logic of the up-down signal UD, a first logic circuit for generating input signal to be supplied to data terminal of the second flip-flop 46, having an inverter 34, two AND gates 35 and 36, a NOR gate 37 and an exclusive NOR gate 38, and a second logic circuit for generating input signal to be supplied to data terminal of the third flip-flop 47, having a NAND gate 39, three AND gates 40 to 42, a NOR gate 43 and an exclusive NOR gate 44.

When the reset signal RCL is at HIGH level, the first to the third flip-flops 45 to 47 operate as ordinary flip-flops.

In the first flip-flop 45, clock terminal is supplied with the count clock CCLK and data terminal is supplied with inverse output of itself.

Therefore, the first flip-flop 45 changes its status with each pulse of the count clock CCLK.

The up-down signal UD is supplied to the inverter 32 to be output to the inverter 33. So, inverse logic of the up-down signal UD is obtained from the inverter 32, which is supplied to the AND gate 35 of the first logic circuit and the AND gate 40 of the second logic circuit, while logic of the up-down signal UD output of the inverter 33 is supplied to the AND gate 36 of the first logic circuit and the AND gates 41 and 42 of the second logic circuit.

In the first logic circuit, inverse output logic of the first flip-flop 45 is supplied to the AND gate 36 and re-inverted by the inverter 34 to be supplied to the AND gate 35. Outputs of the AND gates 35 and 36 are supplied to the NOR gate 37 and its output is supplied to the exclusive NOR gate 38 together with inverse output logic of the second flip-flop 46.

Therefore, output logic of the first flip-flop 45 is output from the NAND gate 37 when the up-down signal UD is at HIGH level, while inverse output logic thereof is output when the up-down signal UD is at LOW level.

In the second flip-flop 46, output of the exclusive NOR gate 38 is supplied to data terminal to be latched according to the count clock CCLK.

Therefore, on condition the up-down signal UD is at HIGH level, the second flip-flop 46 changes its status according to the count clock CCLK when logic of the output signal COU1 is HIGH, while it changes its status when the logic of the output signal COU1 is LOW on condition the up-down signal UD is at LOW level.

In the second logic circuit, NAND logic of the inverse output logic of the first flip-flop 45 and that of the second flip-flop 46 is supplied to the AND gate 40 through the NAND gate 39. To the AND gates 41 and 42, inverse output logic of the first and the second flip-flops 45 and 46 is supplied, respectively. To the exclusive NOR gate 44, NOR logic of outputs of the three AND gates 40 to 42 is supplied together with inverse output logic of the third flip-flop 47.

Output of the exclusive NOR gate 44 is supplied to data terminal of the third flip-flop 47 which is clocked with the count clock CCLK.

Therefore, on condition the up-down signal UD is at HIGH level, the third flip-flop 47 changes its status according to the count clock CCLK when logic of both the output signals COU1 and COU2 is HIGH, while it changes its status when the logic of both the output signals COU1 and COU2 is LOW on condition the up-down signal UD is at LOW level.

Thus, the count value COU of three bits represented by output signals COU1 to COU3 is counted up according to the count clock CCLK when the up-down signal UD is at HIGH level and it is counted down according to the count clock CCLK when the up-down signal UD is at LOW level.

Heretofore, the up-down counter 13 is described in connection with the example of FIG. 6 having a bit width of three bits. However, it is apparent that an up-down counter of any bit width can be configured in a similar way with the example.

Now, configuration of the first to the third flip-flops 45 to 47 is described referring to FIGS. 7(A) and 7(B).

FIG. 7(A) is a circuit diagram illustrating an example of a flip-flop to be applied for the first to the third flip-flops 45 to 47 of FIG. 6, comprising;

four transfer gates 48, 50, 52 and 54, each having a parallel connection of a pMOS transistor and a nMOS transistor, four inverters 49, 51, 53 and 55, logic circuit for generating control signals of the four transfer gates 48, 50, 52 and 54, having a NAND gate 57, a NOR gate 60 and three inverters 58, 59 and 61, and a nonvolatile memory cell 56.

Signals of the clock terminal C and a reset terminal supplied with the reset signal RCL are supplied to the NAND gate 57. A pair of complementary control signals C1B and C1 are obtained as output logic of the NAND gate 57 and its inverted logic through the inverter 58. Another pair of complementary signals C2B and C2 are obtained as output logic of the NOR gate 60 and inverted logic through the inverter 61, the NAND gate 60 being supplied with signal of the clock terminal C and inverted logic of the reset signal RCL through the inverter 59.

The two pairs of the complementary control signals C1, C1B and C2, C2B are supplied to t he four transfer gates 48, 50, 52 and 54, so that each of the transfer gates 48, 50, 52 and 54 is controlled according to logic of the reset signal RCL and the signal supplied to the clock terminal C as shown in a table chart of FIG. 7(B).

Signal supplied to a data terminal D is supplied to the inverter 49 through the transfer gate 48. Output of the inverter 49 is supplied to the inverter 51 through the transfer gate 50 to be output from output terminal Q. The output of the inverter 49 is inverted by the inverter 53 and fed back to the inverter 49 through the transfer gate 52, while the output of the inverter 51 is inverted by the inverter 55 to be output from inverse output terminal and fed back to the inverter 51 through the transfer gate 54.

The output of the inverter 51 is also supplied to write terminal DI of the nonvolatile memory 56 to be memorized controlled with the timing signal STR supplied there. The memorized logic of the nonvolatile memory 56 is read out from read terminal DO to be supplied to the inverter 49 when the reset signal RCL is at LOW level.

Referring to FIG. 7(B), when the reset signal RCL is at LOW level, only the transfer gate 50 becomes ON. Therefore, the memorized logic of the nonvolatile memory 56 is output from the output terminal Q.

When the reset signal RCL is at HIGH level, the transfer gates 48 and 54 become ON while the clock terminal C is at LOW level, latching logic of the data terminal D, which is output from the output terminal Q. When the clock terminal C turns to HIGH level, the transfer gates 50 and 52 becomes ON and the transfer gates 48 and 54 turning to OFF.

Thus, the circuit example of FIG. 7(A) operates as an ordinary flip-flop composed of a master latch and a slave latch, when the reset signal RCL is at HIGH level.

When the timing signal STR becomes HIGH, output logic of the output terminal Q at that timing is memorized in the nonvolatile memory cell 56.

Figure 8:
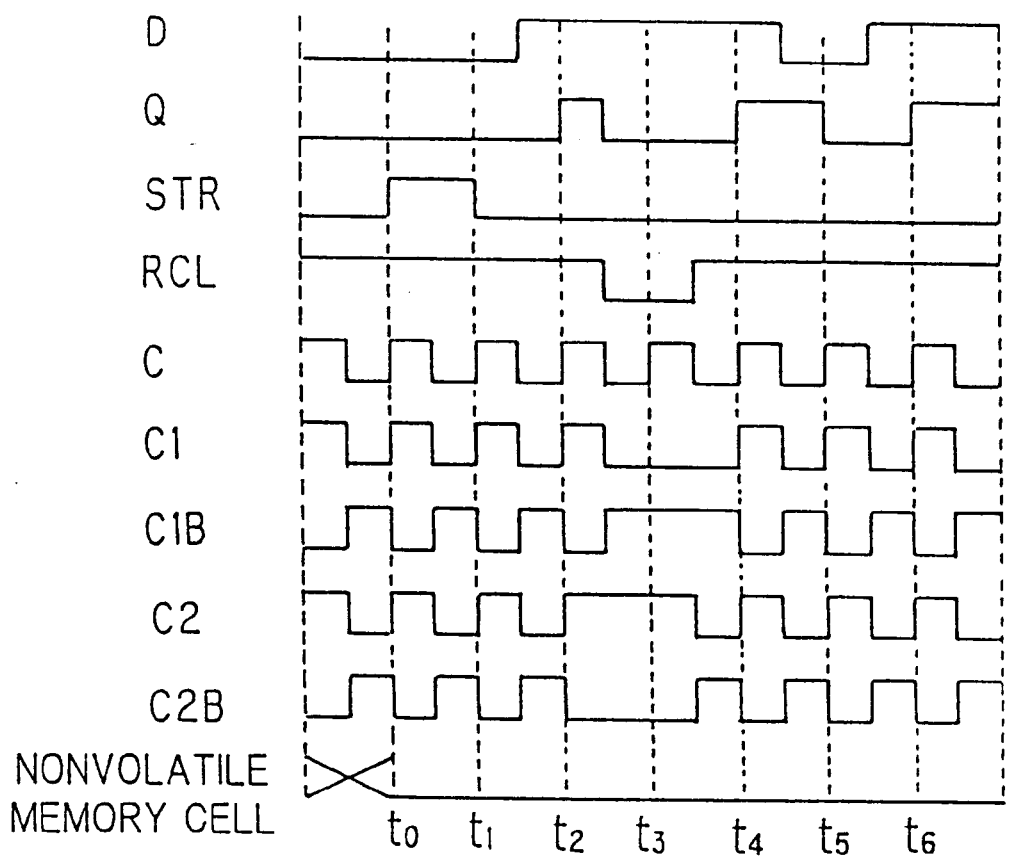
FIG. 8 is a timing chart illustrating transition of signals in the circuit example of FIG. 7(A)

FIG. 8 is a timing chart illustrating transition of signals in the circuit example of FIG. 7(A), wherein logic of the data terminal D at each timing $t_0$ to $t_6$ is output from the output terminal Q and memorized in the nonvolatile memory cell 56 at timing $t_0$ controlled with the timing signal STR, which is output at a timing between $t_2$ and $t_3$ controlled with LOW level of the reset signal RCL.

Thus, in the embodiment, the count value COU at a timing when the PLL circuit is stably phase locked with the reference clock signal RCLK after the initialization is memorized in the up-down counter 13, to be read out and output when initialized next by the reset signal RCL. Therefore, the D/A converter 15 can output the control voltage VCT having a voltage almost corresponding to frequency of the reference clock signal RCLK just after the initialization, malting the frequency drawing time remarkably short, however wide the bit width of the up-down counter 13 is enlarged in order to reduce the frequency jitter.

Heretofore, the present invention is described in connection with the embodiment of FIG. 1 and their circuit examples. However, there can be considered a various modification in the scope of the invention.

Figure 9:
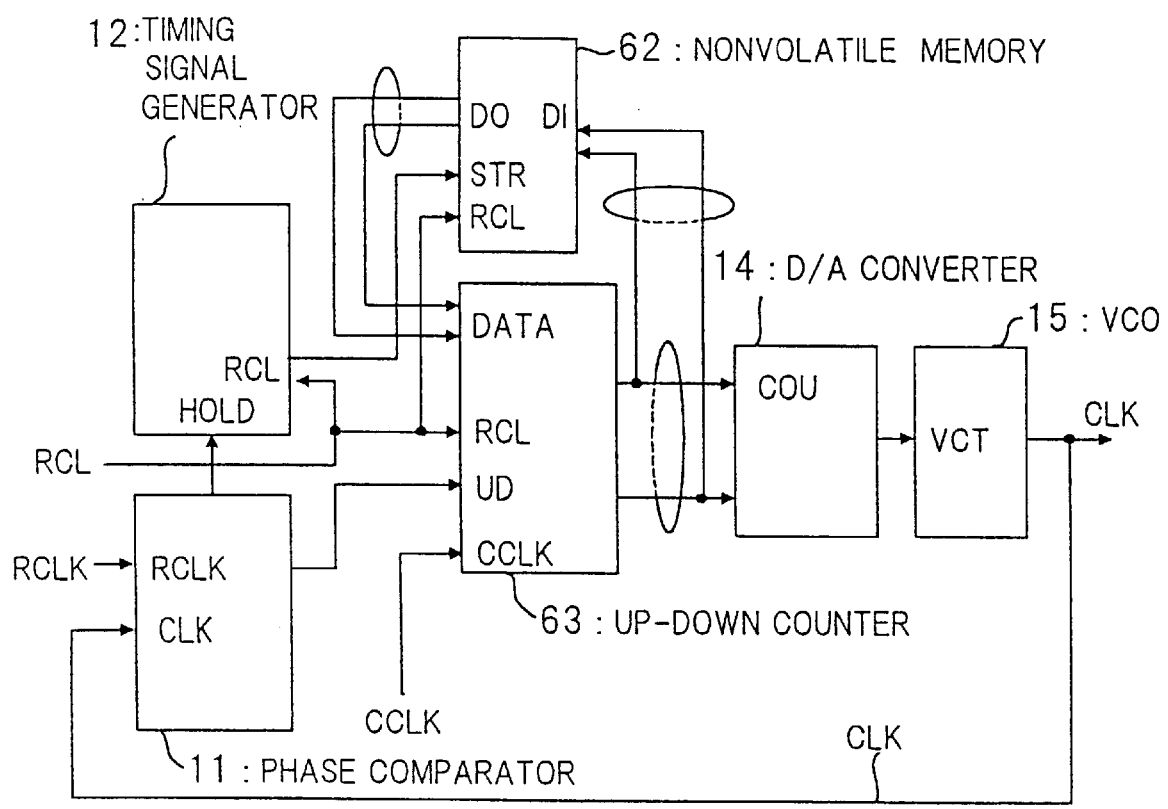
FIG. 9 is a block diagram illustrating another embodiment of the invention.

FIG. 9 is a block diagram illustrating another embodiment of the invention, wherein the up-down counter 13 of FIG. 1 is replaced with a nonvolatile memory 62 and an up-down counter 63 similar to the up-down counter 13 of FIG. 6 configured with flip-flops without nonvolatile memory cell.

Other components of FIG. 9 may be the same to the embodiments of FIG. 1 and duplicated description is omitted.

The nonvolatile memory 62 having the same bit width with the up-down counter 63 memorizes logic of each parallel output of the up-down counter 63 when controlled with the timing signal STR, which is supplied to data terminals of the up-down counter 63 when the reset signal RCL is at LOW level. The up-down counter 63 sets logic of each data terminal to each flip-flop therein when initialized with the reset signal RCL. Logic of each flip-flop is output as each of the parallel outputs representing the count value COU, which is incremented or decremented in the same way with the up-down counter 13 of FIG. 6.

In the embodiment of FIG. 9, operating the same, nonvolatile memory cells can be prepared separately from other elements, enabling an easy design and a smaller chip size compared to the embodiment of FIG. 1 or FIG. 7(A).

What is claimed is:

1. A PLL (Phase Locked Loop) circuit comprising:

a phase comparator for generating an up-down signal which is turned to logic LOW when a phase of an output clock signal is advanced to a phase of a reference clock signal and turned to logic HIGH when said phase of said output clock signal is delayed to said phase of said reference clock signal, and a phase lock signal indicating synchronization of said output clock signal and said reference clock signal;

a timing signal generator for generating a timing signal when said phase lock signal is generated for a certain period after said timing signal generator is initialized with a reset signal;

an up-down counter, supplied with said reset signal, said up-down signal, said timing signal and a count clock, for generating a count value which is incremented when said up-down signal is at said logic HIGH and decremented when said up-down signal is at said logic LOW according to each pulse of said count clock, memorizing said count value in a nonvolatile memory cell in accordance with said timing signal, and outputting said count value memorized in the nonvolatile memory cell when initialized by said reset signal;

a D/A (Digital to Analog) converter for outputting a control voltage in proportion to said count value; and a VCO (Voltage Controlled Oscillator) for providing said output clock signal according to said control voltage.

2. The PLL circuit recited in claim 1, said phase comparator comprising:

two flip-flops, a data terminal of each of said two flip-flops being supplied with logic high, clock terminals of said two flip-flops being supplied with said output clock signal and said reference clock signal, respectively, and reset terminals of said two flip-flops being supplied with NANDed logic of output terminals of said two flip-flops;

a first RS-latch for outputting said up-down signal, a set terminal of said first RS-latch being supplied with NANDed logic of one of said output terminals corresponding to said reference clock signal and inverse logic of the other of said output terminals, and a reset terminal of said first RS-latch supplied with NANDed logic of inverse logic of said one of said output terminals corresponding to said reference clock signal and logic of the other of said output terminals;

a second RS-latch, a set terminal of said second RS-latch being supplied with logic of said set terminal of said first RS-latch, and a reset terminal of said second RS-latch being supplied with said reference clock signal;

a third RS-latch, a set terminal of said third RS-latch being supplied with logic of said reset terminal of said first RS-latch, and a reset terminal of said third RS-latch being supplied with said output clock signal; and an AND gate for outputting said phase lock signal, having AND logic of outputs of said second RS-latch and said third RS-latch.

3. The PLL circuit recited in claim 1, wherein said timing signal generator discriminates said certain period by counting a pulse number of said phase lock signal after initialization with said reset signal.

4. The PLL circuit recited in claim 3, said timing signal generator comprising:

a counter for counting said pulse number and outputting parallel outputs indicating a binary value of said pulse number;

an AND gate for outputting AND logic of said parallel outputs;

a flip-flop for outputting said timing signal, a data terminal thereof being supplied with said AND logic, a clock terminal thereof supplied with said phase lock signal and a reset terminal supplied with said reset signal;

an RS-latch, a set terminal thereof being supplied with said reset signal, and a reset terminal thereof supplied with inverse logic of said timing signal; and a second AND gate for outputting AND logic of said reset signal and an output of said RS-latch, said AND logic supplied to a reset terminal of said counter for resetting said counter.

5. The PLL circuit recited in claim 1, said up-down counter comprising:

n flip-flops, n being an integer more than 1, each clocked with said count clock, a data terminal of a first of said n flip-flops being supplied with inverse logic of an output of said first of said n flip-flops, and a data terminal of i-th of said n flip-flops, i being an integer from 2 to n−1, being supplied with exclusive NOR logic of inverse logic of an output of said i-th of said n flip-flops and (i−1)-th of n−1 data signals; and n−1 logic circuits, (i−1)-th of said n−1 logic circuits making logic of said (i−1)-th of said n−1 data signals become HIGH only when output logic of each of said first to said (i−1)-th of said n flip-flops is HIGH on condition logic of said up-down signal is HIGH, and making said logic of said (i−1)-th of said n−1 data signals become HIGH only when output logic of each of said first to said (i−1)-th of said n flip-flops is LOW on condition logic of said up-down signal is LOW.

6. The PLL circuit recited in claim 5, wherein each of said n flip-flops comprises a nonvolatile memory cell for storing output logic of said each of said n flip-flops when controlled with said timing signal, and outputting said output logic stored therein as output logic of said each of said n flip-flops when controlled with said reset signal.

7. The PLL circuit recited in claim 6, wherein each of said n flip-flops further comprises:

a first logic circuit operating as a master latch for latching logic of said data terminal of said each of said n flip-flops when logic of said count clock is LOW on condition logic of said reset signal is HIGH, and transferring said output logic stored in said nonvolatile memory cell on condition said logic of said reset signal is LOW; and a second logic circuit operating as a slave latch for outputting said logic of said data terminal latched in said first logic circuit when logic of said count clock is HIGH on condition said logic of said reset signal is HIGH, and outputting said output logic transferred from said first logic circuit on condition said logic of said reset signal is LOW.

8. A PLL circuit comprising:

a phase comparator for generating an up-down signal which is turned to logic LOW when a phase of an output clock signal is advanced to a phase of a reference clock signal and turned to logic HIGH when said phase of said output clock signal is delayed to said phase of said reference clock signal, and a phase lock signal indicating synchronization of said output clock signal and said reference clock signal;

a timing signal generator for generating a timing signal when said phase lock signal is generated for a certain period after said timing signal generator is initialized with a reset signal;

an up-down counter, supplied with said reset signal, said up-down signal, and a count clock, for generating a count value which is incremented when said up-down signal is at said logic HIGH and decremented when said up-down signal is at said logic LOW according to each pulse of said count clock, said count value being initialized according to data signals, controlled with said reset signal;

a nonvolatile memory cell array for storing said count value when controlled by said timing signal, and outputting said count value stored therein as said data signals, controlled with said reset signal;

a D/A converter for outputting a control voltage in proportion to said count value output from said up-down counter; and a VCO for providing said output clock signal according to said control voltage.

9. The PLL circuit recited in claim 8, said phase comparator comprising:

two flip-flops, a data terminal of each of said two flip-flops being supplied with logic high, clock terminals of said two flip-flops being supplied with said output clock signal and said reference clock signal, respectively, and reset terminals of said two flip-flops being supplied with NANDed logic of output terminals of said two flip-flops;

a first RS-latch for outputting said up-down signal, a set terminal of said first RS-latch being supplied with NANDed logic of one of said output terminals corresponding to said reference clock signal and inverse logic of the other of said output terminals, and a reset terminal of said first RS-latch supplied with NANDed logic of inverse logic of said one of said output terminals corresponding to said reference clock signal and logic of the other of said output terminals;

a second RS-latch, a set terminal of said second RS-latch being supplied with logic of said set terminal of said first RS-latch, and a reset terminal of said second RS-latch being supplied with said reference clock signal;

a third RS-latch, a set terminal of said third RS-latch being supplied with logic of said reset terminal of said first RS-latch, and a reset terminal of said third RS-latch being supplied with said output clock signal; and an AND gate for outputting said phase lock signal, having AND logic of outputs of said second RS-latch and said third RS-latch.

10. The PLL circuit recited in claim 8, wherein said timing signal generator discriminates said certain period by counting a pulse number of said phase lock signal after initialization with said reset signal.

11. The PLL circuit recited in claim 10, said timing signal generator comprising:

a counter for counting said pulse number and outputting parallel outputs indicating a binary value of said pulse number;

an AND gate for outputting AND logic of said parallel outputs;

a flip-flop for outputting said timing signal, a data terminal thereof being supplied with said AND logic, a clock terminal thereof supplied with said phase lock signal and a reset terminal supplied with said reset signal;

an RS-latch, a set terminal thereof being supplied with said reset signal, and a reset terminal thereof supplied with inverse logic of said timing signal; and a second AND gate for outputting AND logic of said reset signal and an output of said RS-latch, said AND logic supplied to a reset terminal of said counter for resetting said counter.

12. The PLL circuit recited in claim 8, said up-down counter comprising:

n flip-flops, n being an integer more than 1, each clocked with said count clock, a data terminal of a first of said n flip-flops being supplied with inverse logic of an output of said first of said n flip-flops, and a data terminal of i-th of said n flip-flops, i being an integer from 2 to n−1, being supplied with exclusive NOR logic of inverse logic of an output of said i-th of said n flip-flops and (i−1)-th of n−1 data signals; and n−1 logic circuits, (i−1)-th of said n−1 logic circuits making logic of said (i−1)-th of said n−1 data signals become HIGH only when output logic of each of said first to said (i−1)-th of said n flip-flops is HIGH on condition logic of said up-down signal is HIGH, and making said logic of said (i−1)-th of said n−1 data signals become HIGH only when output logic of each of said first to said (i−1)-th of said n flip-flops is LOW on condition logic of said up-down signal is LOW.

* * * * *